United States Patent
Kuo

(10) Patent No.: US 6,873,399 B2
(45) Date of Patent: Mar. 29, 2005

(54) EXPOSURE SYSTEM AND METHOD

(75) Inventor: Jung-Chih Kuo, Taichung (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/628,898

(22) Filed: Jul. 28, 2003

(65) Prior Publication Data

US 2004/0218159 A1 Nov. 4, 2004

(30) Foreign Application Priority Data

Apr. 30, 2003 (TW) .......................... 92110136 A

(51) Int. Cl.[7] .................... G03B 27/68; G03B 27/52
(52) U.S. Cl. ............................ 355/52; 355/55
(58) Field of Search ................ 355/52, 53, 67–71, 355/77, 55; 356/399–401; 430/30–311

(56) References Cited

U.S. PATENT DOCUMENTS

| | | | | |
|---|---|---|---|---|
| 5,965,309 A | * | 10/1999 | Ausschnitt et al. | 430/30 |
| 6,221,787 B1 | * | 4/2001 | Ogata | 438/758 |
| 6,368,883 B1 | * | 4/2002 | Bode et al. | 438/14 |
| 6,700,648 B2 | * | 3/2004 | Jun et al. | 355/77 |
| 2002/0111038 A1 | * | 8/2002 | Matsumoto et al. | 438/763 |
| 2003/0059691 A1 | | 3/2003 | Morimoto | |

* cited by examiner

*Primary Examiner*—Henry Hung Nguyen
(74) *Attorney, Agent, or Firm*—Quintero Law Office

(57) ABSTRACT

An exposure system. The exposure system includes a compensation unit and an exposure device. The compensation unit receives at least one adjustment value of a corresponding equipment parameter, and compensates a corresponding overlay parameter according to the adjustment value and an adjustment formula corresponding to the equipment parameter. The exposure device performs overlay and exposure processes on a wafer using the compensated overlay parameter.

20 Claims, 7 Drawing Sheets

| Equipment Parameter | Overlay Parameter | Adjustment Formula |
|---|---|---|
| FIA_X (um) | Offset_X(um) | B = -1.0883*A - 0.0016 |
| FIA_Y (um) | Offset_Y(um) | B = -1.0232*A - 0.0023 |
| Lens Mag Matching Offset X (um) | Shot Scaling X (ppm) | B = -84.853*A + 0.0639 |
| Machine Scaling Y (ppm) | Shot Scaling Y (ppm) | B = -1.0053*A - 0.0193 |
| LSA_X (um) | Offset_X (um) | B = -0.9958*A + 0.0011 |
| LSA_Y (um) | Offset_Y (um) | B = -1.0042*A - 0.0004 |
| Shot Skew(urad) | Shot Ortho(urad) | B = -0.9422*A + 0.0094 |
| Machine Shot Rot(urad) | Shot Rot(urad) | B = -1.0247*A - 0.0214 |

FIG. 2

EXPOSURE SYSTEM AND METHOD

BACKGROUND OF THE INVENTION

1. Field of the Invention

The present invention relates to an exposure system and method, and particularly to an exposure system and method with recipe compensation for an adjusted exposure device in semiconductor manufacturing.

2. Description of the Related Art

Photolithography is one of the most important technologies in semiconductor manufacturing. It seriously affects structures of MOS devices, such as patterns of layers and doped regions. Typically, the number of masks used in photolithography indicates the complexity of a manufacturing process. As described above, since photolithography is complicated, the exposure device performing the photolithography can create a bottleneck in semiconductor manufacturing.

Exposure of wafers is generally implemented in a "Step and Repeat" fashion to transfer high resolution patterns to the wafers, the exposure device is thus referred to as Stepper. That is to say, the pattern on the mask is projected and sized to one portion or block of the wafer. This is repeatedly implemented for all blocks on the wafer one by one until the entire wafer is exposed.

Since only the pattern of one layer is transferred to the wafer after each block is exposed and there are many patterns of layers and corresponding masks involved in one manufacturing process, piece alignment between the blocks of the wafer, overlay alignment between the patterns of the layers is essential to the photolithography processing step.

However, performance of an exposure device always slightly varies with time. For a precisely accurate exposure, the wafers processed must be measured to compensate for parameters (recipe) used by the exposure device. The recipe will be compensated and used by the exposure device to process the subsequent wafers. In general, the recipe compensation is implemented manually or using a feedback system. Taiwanese Patent 516099 discloses a method and apparatus of wafer exposure with correction feedback that employs a feedback system using a computer system to calculate values and use the values to compensate overlay parameters.

However, 516099 is designed for parameter adjustment between lot wafers processed by the exposure device with time. If the exposure device encounters malfunction or failure, or for routine maintenance purpose, in which the exposure device needs to be adjusted, there is no effective mechanism of recipe compensation for the exposure device. Pilot wafers are processed by the exposure device and then measured to obtain the compensation with some approximate calculations. It is time-consuming and increase the rework rate, thereby resulting in mistakes, and impacting throughput of the manufacturing process.

SUMMARY OF THE INVENTION

It is therefore an object of the present invention to provide an exposure system and method with recipe compensation for an adjusted exposure device in semiconductor manufacturing.

To achieve the above object, the present invention provides an exposure system. The exposure system includes a compensation unit and an exposure device. The compensation unit receives at least one adjustment value of a corresponding equipment parameter, and compensates a corresponding overlay parameter according to the adjustment value and an adjustment formula corresponding to the equipment parameter. The exposure device performs overlay and exposure processes on a wafer using the compensated overlay parameter.

Further, an exposure method is provided. First, at least one adjustment value of a corresponding equipment parameter is received. Then, a corresponding overlay parameter is compensated according to the adjustment value and an adjustment formula corresponding to the equipment parameter. Then, a wafer undergoes overlay and exposure processes using the compensated overlay parameter.

BRIEF DESCRIPTION OF THE DRAWINGS

The aforementioned objects, features and advantages of the invention will become apparent by referring to the following detailed description of the preferred embodiment with reference to the accompanying drawings, wherein:

FIG. 2 is a table recording adjustment formulas between the equipment parameters and corresponding affected overlay parameters;

DETAILED DESCRIPTION OF THE INVENTION

Figure 1:
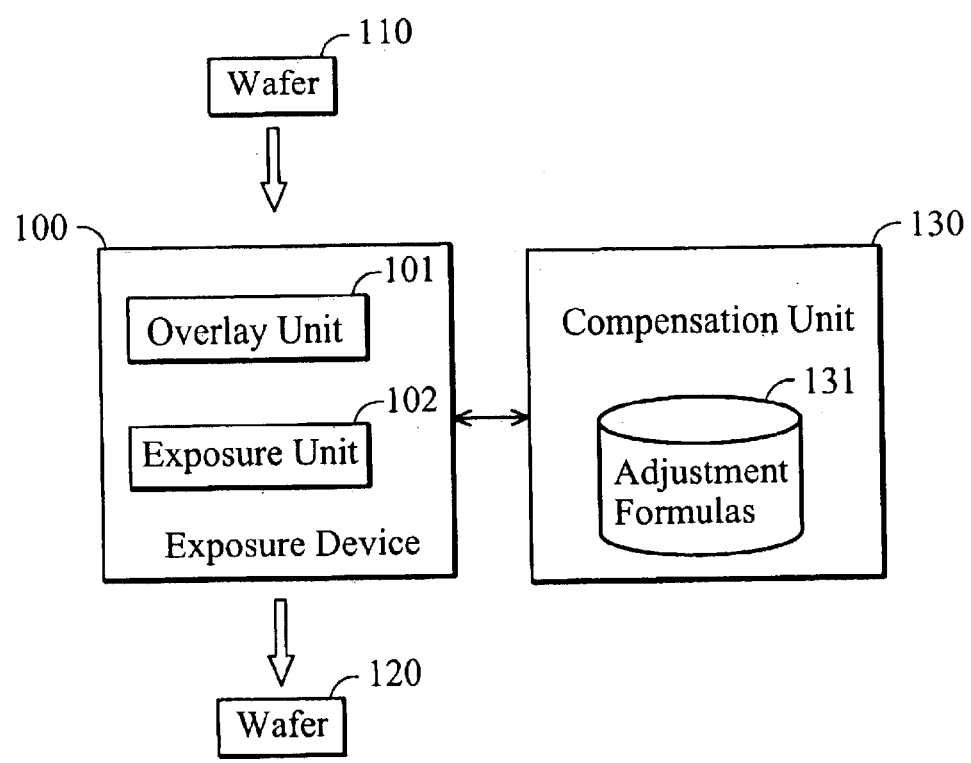
FIG. 1 is a schematic diagram illustrating an exposure system according to the present invention.
Figure 3A:
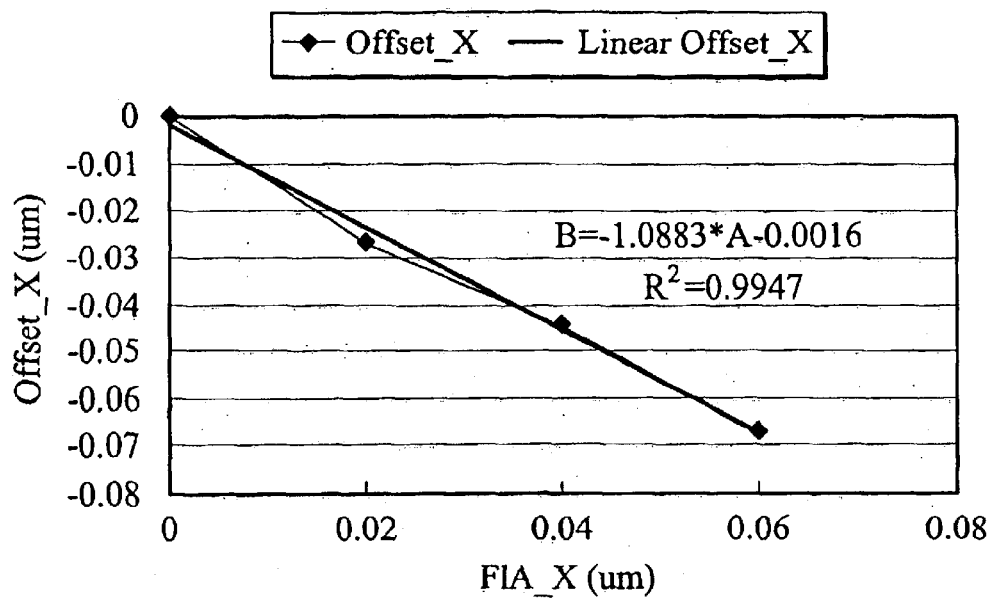
FIGS. 3A to 3H are diagrams illustrating the numerical analyses of respective adjustment formula.
Figure 3B:
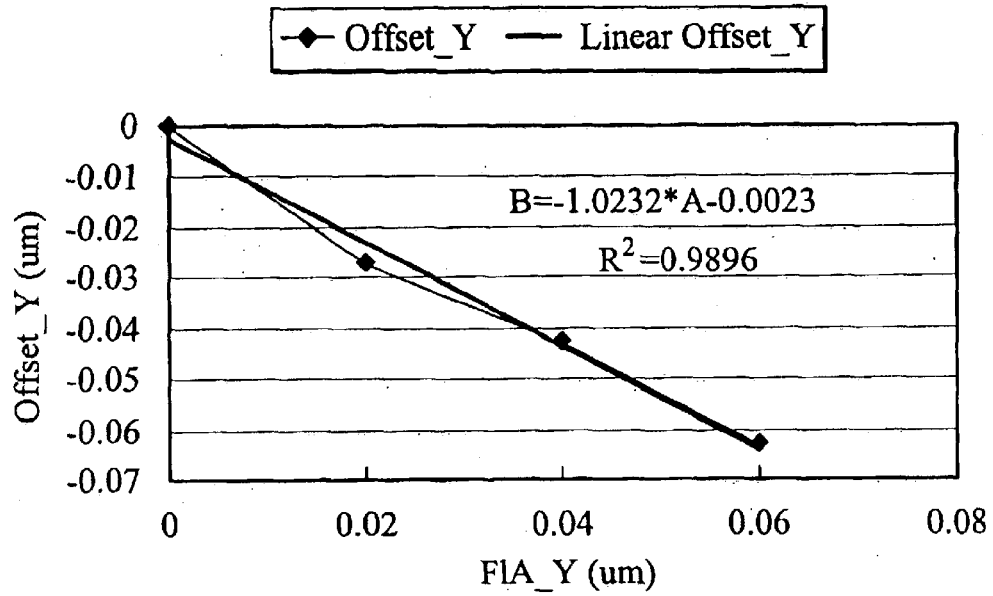
Figure 3C:
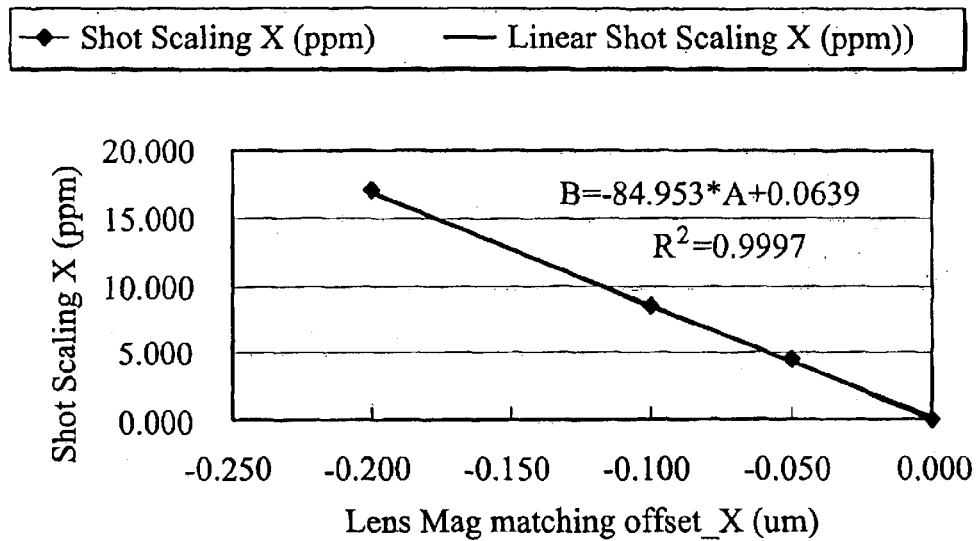
Figure 3D:
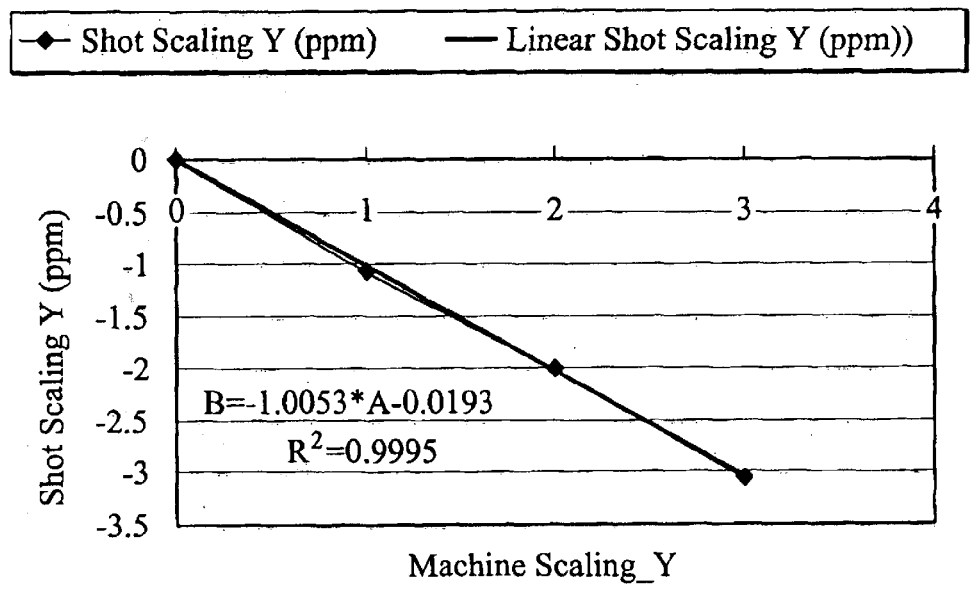
Figure 3E:
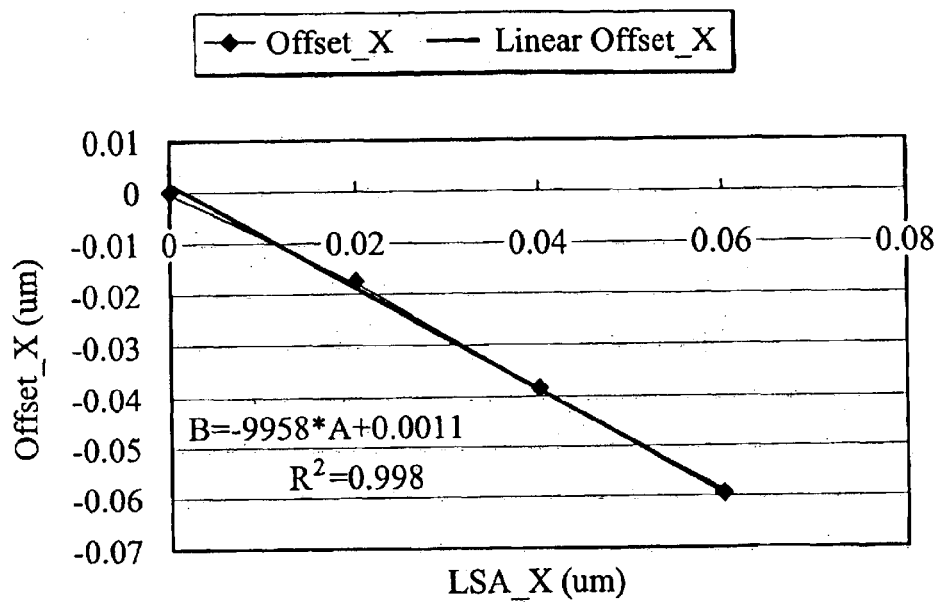
Figure 3F:
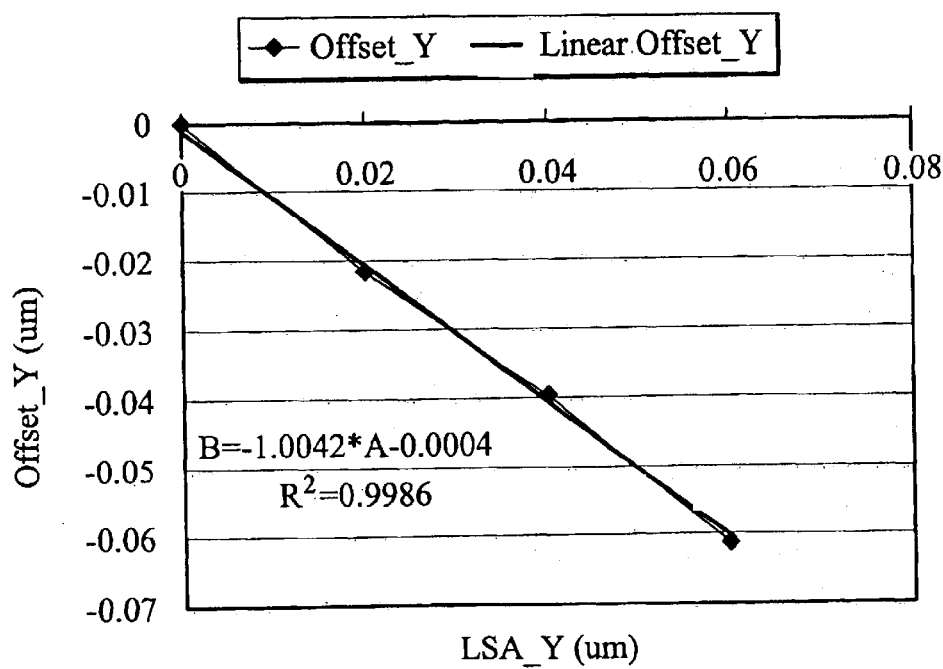
Figure 3G:
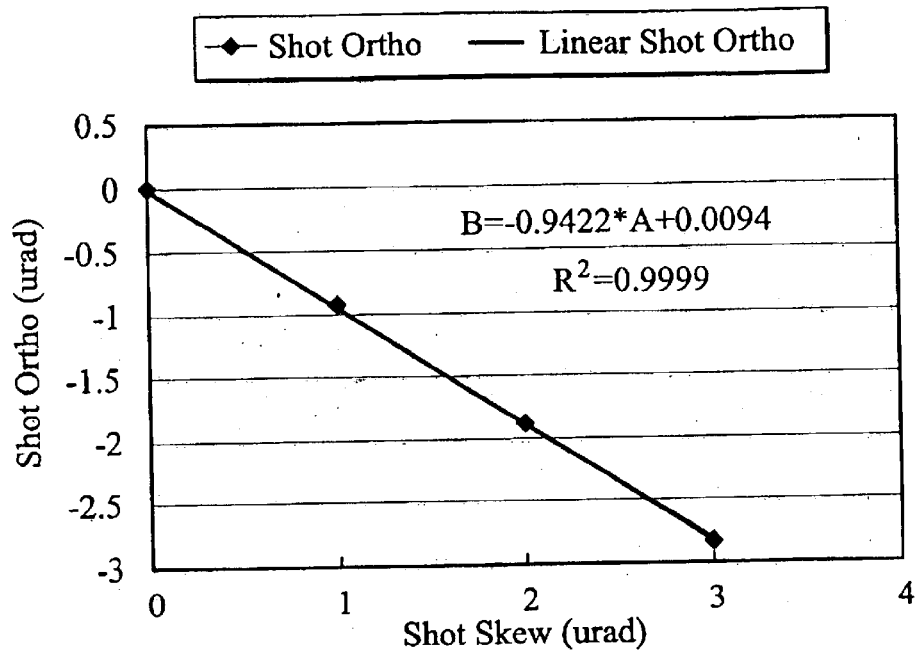
Figure 3H:
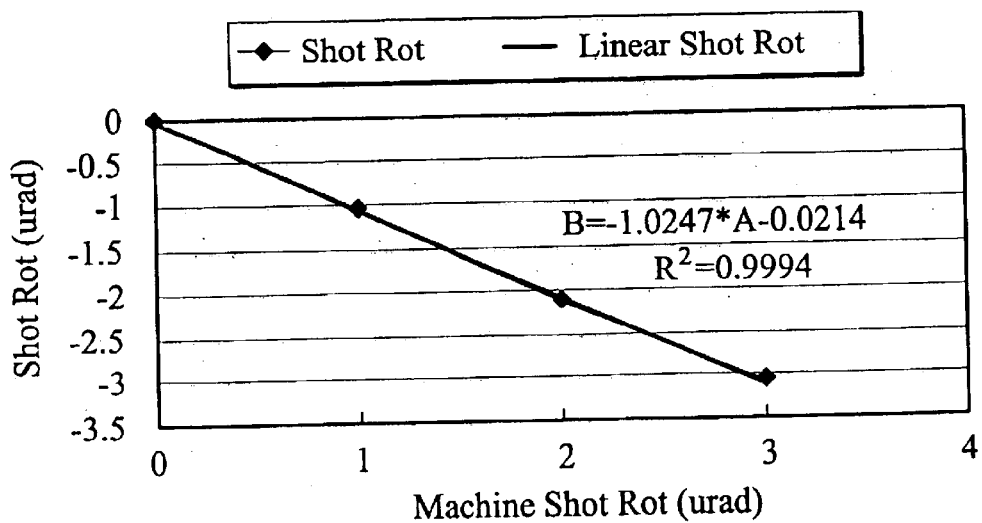

FIG. 1 illustrates the exposure system according to the present invention. The exposure system includes an exposure device 100 and a compensation unit 130.

The exposure device 100 includes an overlay unit 101 and an exposure unit 102. The overlay unit 101 performs an overlay process including piece alignment of blocks and overlay alignment of layers on a wafer 110 according to overlay parameters, such as offset of X axis (Offset_X), offset of Y axis (Offset_Y), shot scaling of X axis (Shot Scaling X), shot scaling of Y axis (Shot Scaling Y), shot orthogonality (Shot Ortho), shot rotation (Shot Rot) and others. The exposure unit 102 performs an exposure process on the wafer 110 after the overlay unit 101 performs the overlay process. After the overlay and exposure processes, the processed wafer 120 may be further processed in other manufacturing steps.

It should be noted that if the exposure device 100 is maintained or adjusted, the exposure device 100 will send adjustment values of corresponding adjusted equipment parameters to the compensation unit 130, and await completion of the compensation of the compensation unit 130. After the compensation unit 130 finishes, the exposure device 100 may continue to perform the overlay and exposure processes on subsequent wafers.

The compensation unit 130 has a database recording adjustment formulas 131 corresponding to respective equipment parameters of the exposure device 100. The equipment parameters may include FIA_X, FIA_Y, lens magnitude matching offset of X axis (Lens Mag Matching Offset X), machine shot scaling of Y axis (Machine Shot Scaling Y), LSA_X, LSA_Y, shot skewness (Shot Skew), machine shot rotation (Machine Shot Rot) and others.

FIG. 2 shows a table 200 recording adjustment formulas between the equipment parameters and corresponding affected overlay parameters. As shown in the table 200, when the equipment parameter is FIA_X, the affected overlay parameter is Offset_X, and the adjustment formula is: B=(−1.0883*A)−0.0016; when the equipment parameter is FIA_Y, the affected overlay parameter is Offset_Y, and the adjustment formula is: B=(−1.0232*A)−0.0023; when the equipment parameter is LSA_X, the affected overlay parameter is Offset_X, and the adjustment formula is: B=(−0.9958*A)+0.0011; when the equipment parameter is LSA_Y, the affected overlay parameter is Offset_Y, and the adjustment formula is: B=(−1.0042*A)−0.0004; when the equipment parameter is Matching Offset X, the affected overlay parameter is Shot Scaling X, and the adjustment formula is: B=(−84.853*A)+0.0639; when the equipment parameter is Machine Scaling Y, the affected overlay parameter is Shot Scaling Y, and the adjustment formula is: B=(−1.0053*A)−0.0193; when the equipment parameter is Shot Skew, the affected overlay parameter is Shot Ortho, and the adjustment formula is: B=(−0.9422*A)+0.0094; and when the equipment parameter is Machine Shot Rot, the affected overlay parameter is Shot Rot, and the adjustment formula is: B=(−1.0247*A)−0.0214, in which A is the adjustment value of the equipment parameter and B is the compensation value of the overlay parameter.

It should be noted that the relationship between the equipment parameters and the overlay parameters may be obtained by repeatedly adding or deleting a predetermined value to that of the each equipment parameter, and numerically analyzing the exposure result of each overlay parameter. The numerical analyses of respective adjustment formulas are shown in FIGS. 3A to 3H, in which numerical analysis may be used to calculate respective linear formulas.

The compensation unit 130 may receive the adjustment value from the exposure device 100, and perform the compensation including calculating a compensation value according to the adjustment value and the adjustment formula corresponding to the adjusted equipment parameter, and compensating the affected overlay parameter according to the compensation value. After the compensation unit 130 finishes the compensation, the exposure device 100 may continue to perform the overlay and exposure processes on subsequent wafers.

Figure 4:
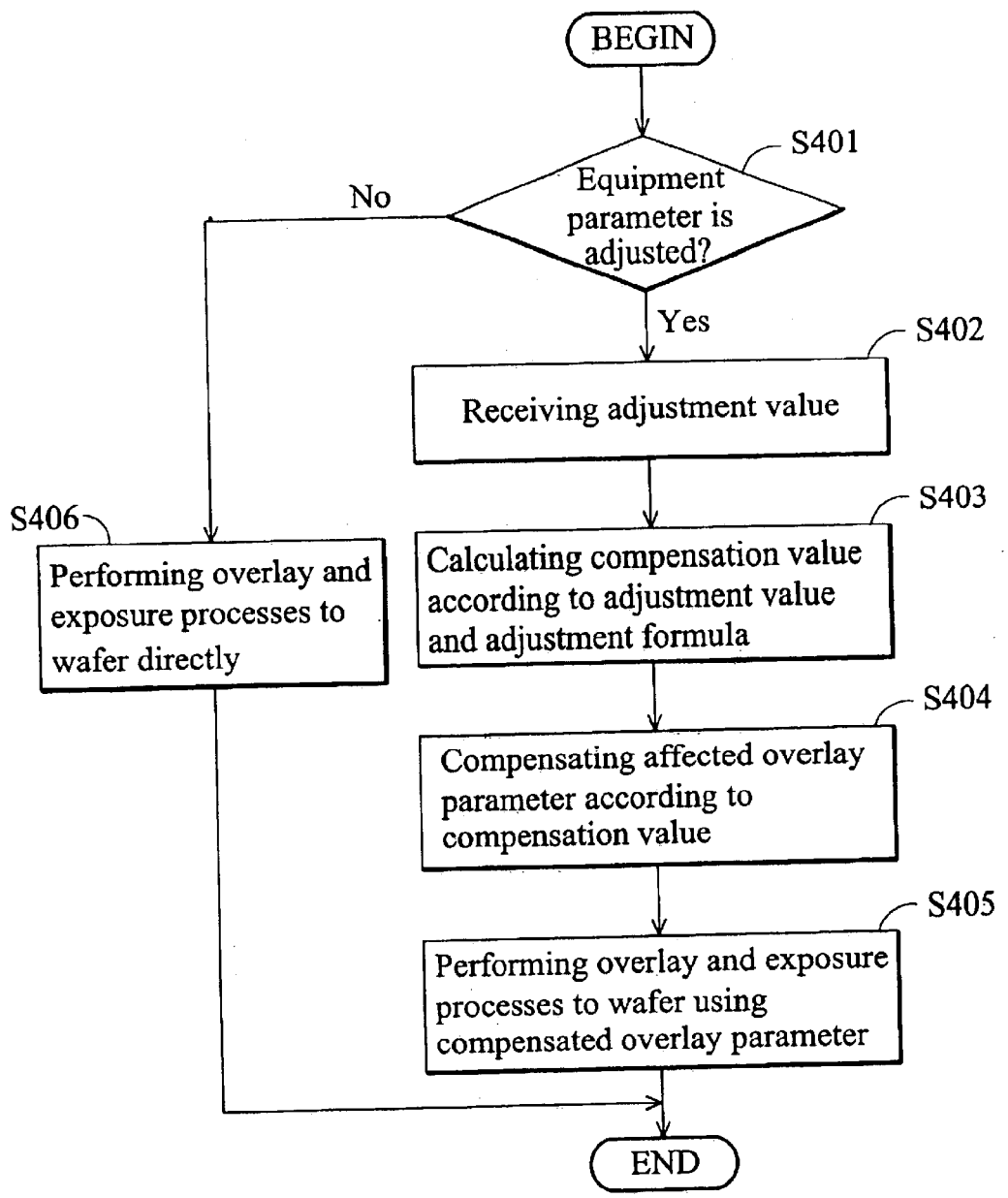
FIG. 4 is a flowchart showing an exposure method according to the present invention.

FIG. 4 shows an exposure method according to the present invention. First, in step S401, the exposure device 100 checks whether the equipment parameters have been adjusted. If the equipment parameters have not been adjusted (No in step S401), in step S406, the exposure device 100 performs the overlay and exposure processes on the wafer using the original overlay parameters directly.

If one of the equipment parameters is adjusted (Yes in step S401), in step S402, the compensation unit 130 receives an adjustment value of the adjusted equipment parameter. Then, in step S403, the compensation unit 130 calculates a compensation value according to the adjustment value and an adjustment formula corresponding to the adjusted equipment parameter. It should be noted that the if several equipment parameters are adjusted, the compensation unit 130 may calculate respective compensation values for each affected overlay parameter according to respective adjustment value and adjustment formula. In addition, the affected overlay parameter can be retrieved by the database recording the adjustment formulas 131 or the table 200.

Then, in step S404, the compensation unit 130 compensates the affected overlay parameter according to the compensation value. Thereafter, in step S405, the exposure device 100 performs the overlay and exposure processes on the wafer using the compensated overlay parameter.

As a result, using the exposure system and method according to the present invention, the adjusted exposure device can be automatically compensated and directly used to perform the overlay and exposure processes on wafers.

Although the present invention has been described in its preferred embodiments, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

What is claimed is:

1. An exposure system, comprising:

a compensation unit to receive at least one adjustment value of a corresponding equipment parameter of the exposure system, and compensate a corresponding overlay parameter according to the adjustment value and an adjustment formula indicating the relationship between the equipment parameter and affected overlay parameter; and an exposure device to perform overlay and exposure processes on a wafer using the compensated overlay parameter.

2. The exposure system as claimed in claim 1 wherein the compensation unit calculates a compensation value according to the adjustment value and the adjustment formula, and compensates the overlay parameter using the compensation value.

3. The exposure system as claimed in claim 2 wherein the equipment parameter is FIA_X, the affected overlay parameter is Offset_X, and the adjustment formula is, $$B=(-1.0883*A)-0.0016,$$

wherein A is the adjustment value and B is the compensation value.

4. The exposure system as claimed in claim 2 wherein the equipment parameter is FIA_Y, the affected overlay parameter is Offset_Y, and the adjustment formula is, $$B=(-1.0232*A)-0.0023,$$

wherein A is the adjustment value and B is the compensation value.

5. The exposure system as claimed in claim 2 wherein the equipment parameter is LSA_X, the effected overlay parameter is Offset_X, and the adjustment formula is $$B=(-0.9958*A)+0.0011,$$

wherein A is the adjustment value and B is the compensation value.

6. The exposure system as claimed in claim 2 wherein the equipment parameter is LSA_Y, the affected overlay parameter is Offset_Y, and the adjustment formula is, $$B=(-1.0042*A)-0.0004,$$

wherein A is the adjustment value and B is the compensation value.

7. The exposure system as claimed in claim 2 wherein the equipment parameter is Matching Offset X, the affected overlay parameter is Shot Scaling X, and the adjustment formula is, $$B=(-84.853*A)+0.0639,$$

wherein A is the adjustment value and B is the compensation value.

8. The exposure system as claimed in claim 2 wherein the equipment parameter is Machine Scaling Y, the affected overlay parameter is Shot Scaling Y, and the adjustment formula is, $$B=(-1.0053*A)-0.0193,$$

wherein A is the adjustment value and B is the compensation value.

9. The exposure system as claimed in claim 2 wherein the equipment parameter is Shot Skew, the affected overlay parameter is Shot Ortho, and the adjustment formula is, $$B=(-0.9422*A)+0.0094,$$

wherein A is the adjustment value and B is the compensation value.

10. The exposure system as claimed in claim 2 wherein the equipment parameter is Machine Shot Rot, the affected overlay parameter is Shot Rot, and the adjustment formula is, $$B=(-1.0247*A)-0.0214,$$

wherein A is the adjustment value and B is the compensation value.

11. An exposure method, comprising the steps of:
receiving at least one adjustment value of a corresponding equipment parameter of the exposure system;
compensating a corresponding overlay parameter according to the adjustment value and an adjustment formula indicating the relationship between the equipment parameter and the affected overlay parameter; and
performing overlay and exposure processes on a wafer using the compensated overlay parameter.

12. The exposure method as claimed in claim 11 further comprising calculating a compensation value according to the adjustment value and the adjustment formula, and compensating the overlay parameter using the compensation value.

13. The exposure method as claimed in claim 12 wherein the equipment parameter is $FIA\_X$, the affected overlay parameter is $Offset\_X$, and the adjustment formula is, $$B=(-1.0883*A)-0.0016,$$

wherein A is the adjustment value and B is the compensation value.

14. The exposure method as claimed in claim 12 wherein the equipment parameter is FIA_Y, the effected overlay parameter is Offset_Y, and the adjustment formula is, $$B=(-1.0232*A)-0.0023,$$

wherein is the adjustment value and B is the compensation value.

15. The exposure method as claimed in claim 12 wherein the equipment parameter is LSA_X, the affected overlay parameter is Offset_X, and the adjustment formula is, $$B=(-0.9958*A)+0.0011,$$

wherein A is the adjustment value and B is the compensation value.

16. The exposure method as claimed in claim 12 wherein the equipment parameter is LSA_Y, the affected overlay parameter is Offset_Y, and the adjustment formula is, $$B=(-1.0042*A)-0.0004,$$

wherein A is the adjustment value and B is the compensation value.

17. The exposure method as claimed in claim 12 wherein the equipment parameter is Matching Offset X, the affected overlay parameter is Shot Scaling X, and the adjustment formula is, $$B=(-84.853*A)+0.0639,$$

wherein A is the adjustment value and B is the compensation value.

18. The exposure method as claimed in claim 12 wherein the equipment parameter is Machine Scaling Y, the affected overlay parameter is Shot Scaling Y, and the adjustment formula is, $$B=(-1.0053*A)-0.0193,$$

wherein A is the adjustment value and B is the compensation value.

19. The exposure method as claimed in claim 12 wherein the equipment parameter is Shot Skew, the affected overlay parameter is Shot Ortho, and the adjustment formula is, $$B=(-0.9422*A)+0.0094,$$

wherein A is the adjustment value and B is the compensation value.

20. The exposure method as claimed in claim 12 wherein the equipment parameter is Machine Shot Rot, the affected overlay parameter is Shot Rot, and the adjustment formula is, $$B=(-1.0247*A)-0.0214,$$

wherein A is the adjustment value and B is the compensation value.

* * * * *